United States Patent
Zhang et al.

(10) Patent No.: US 8,233,945 B2
(45) Date of Patent: *Jul. 31, 2012

(54) ROTARY COVER MECHANISM FOR PORTABLE ELECTRONIC DEVICES

(75) Inventors: Xu-Ri Zhang, Shenzhen (CN); Ye Liu, Shenzhen (CN); Xin-Quan Zhou, Shenzhen (CN); Hsiao-Hua Tu, Taipei Hsien (TW)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 810 days.

This patent is subject to a terminal disclaimer.

(21) Appl. No.: 12/235,718

(22) Filed: Sep. 23, 2008

(65) Prior Publication Data

US 2009/0305753 A1 Dec. 10, 2009

(30) Foreign Application Priority Data

Jun. 4, 2008 (CN) .......................... 2008 1 0302004

(51) Int. Cl.
*H04M 1/00* (2006.01)

(52) U.S. Cl. ................. 455/575.1; 455/575.4; 455/90.3; 455/550.1

(58) Field of Classification Search ............... 455/575.1, 455/575, 575.4, 575.8, 90.3, 550.13, 550.1
See application file for complete search history.

(56) References Cited

U.S. PATENT DOCUMENTS

| | | | |
|---|---|---|---|
| 7,047,053 B2 * | 5/2006 | Lee ............................ | 455/575.3 |
| 7,139,596 B2 * | 11/2006 | SanGiovanni ............. | 455/575.1 |
| 7,158,371 B2 * | 1/2007 | Park et al. ................. | 361/679.08 |
| 7,395,101 B2 * | 7/2008 | Kim ........................... | 455/575.3 |
| 7,419,099 B2 * | 9/2008 | Lee et al. .................. | 235/472.01 |
| 7,496,194 B2 * | 2/2009 | Jeun .......................... | 379/433.11 |
| 7,590,435 B2 * | 9/2009 | Park et al. .................. | 455/575.3 |
| 7,865,151 B2 * | 1/2011 | Cho ............................ | 455/90.3 |
| 7,866,000 B2 * | 1/2011 | Lee et al. ........................ | 16/334 |
| 7,907,978 B2 * | 3/2011 | Nishijima et al. ......... | 455/575.1 |
| 2004/0121825 A1 * | 6/2004 | Ma et al. .................... | 455/575.4 |
| 2005/0137000 A1 * | 6/2005 | Toh et al. ................... | 455/575.4 |
| 2005/0202856 A1 * | 9/2005 | Park et al. .................. | 455/575.1 |
| 2008/0039158 A1 * | 2/2008 | Park et al. .................. | 455/575.3 |
| 2008/0064453 A1 * | 3/2008 | Park et al. .................. | 455/575.3 |

* cited by examiner

*Primary Examiner* — Pablo Tran
(74) *Attorney, Agent, or Firm* — Altis Law Group, Inc.

(57) ABSTRACT

A rotary mechanism includes a base (10), a cover (30), a torsion spring (40) and a locking module (20). The rotary cover is rotatably mounted to the base. Two ends of the torsion spring are fixed with the base and the cover, respectively. The locking module limits the cover from rotating relative to the base. When the cover overcomes the limitation of the locking module, the cover can automatically rotate relative to the base due to the torsion spring.

20 Claims, 5 Drawing Sheets

ROTARY COVER MECHANISM FOR PORTABLE ELECTRONIC DEVICES

CROSS-REFERENCE TO RELATED APPLICATION

This application is related to co-pending U.S. patent application Ser. No. 12/195,535, entitled "ROTARY COVER MECHANISM FOR PORTABLE ELECTRONIC DEVICES", by Ye Liu et al., which has the same assignee as the present application. The above-identified application is incorporated herein by reference.

BACKGROUND

1. Field of the Invention

The present invention relates to rotary cover mechanisms and, particularly, to rotary cover mechanisms for portable electronic devices, such as mobile phones and portable computers.

2. Description of Related Art

With the development of wireless communication and information processing technologies, portable mobile terminals, such as mobile phones and personal digital assistants (PDAs), are now in widespread use.

Typical portable electronic devices such as mobile phones mainly include bar mobile phones, foldable mobile phones, slidable mobile phones, and rotatable mobile phones. Rotatable mobile phones have a newer structure which allows the mobile phone to be compact with a modern, novel design.

A traditional rotating mechanism for a mobile phone includes a cover having a display and a body having a keypad. When a user holds this type of mobile phone with one hand, the cover is rotated 180 degrees relative to the body to expose the keypad. When the mobile phone is closed, the cover covers the body, and the keypad is hidden. However, when opening or closing the phone, the mobile phone needs a continued external force to rotate the cover relative to the body. This can make one-handed operation very difficult.

Therefore, there is a room for improvement within the art.

BRIEF DESCRIPTION OF THE DRAWINGS

Many aspects of the present rotating mechanism can be better understood with reference to the following drawings. The components in the drawings are not necessarily drawn to scale, the emphasis instead being placed upon clearly illustrating the principles of the present rotating mechanism. Moreover, in the drawings, like reference numerals designate corresponding parts throughout the several views, in which.

DETAILED DESCRIPTION OF THE EXEMPLARY EMBODIMENTS

Figure 1:
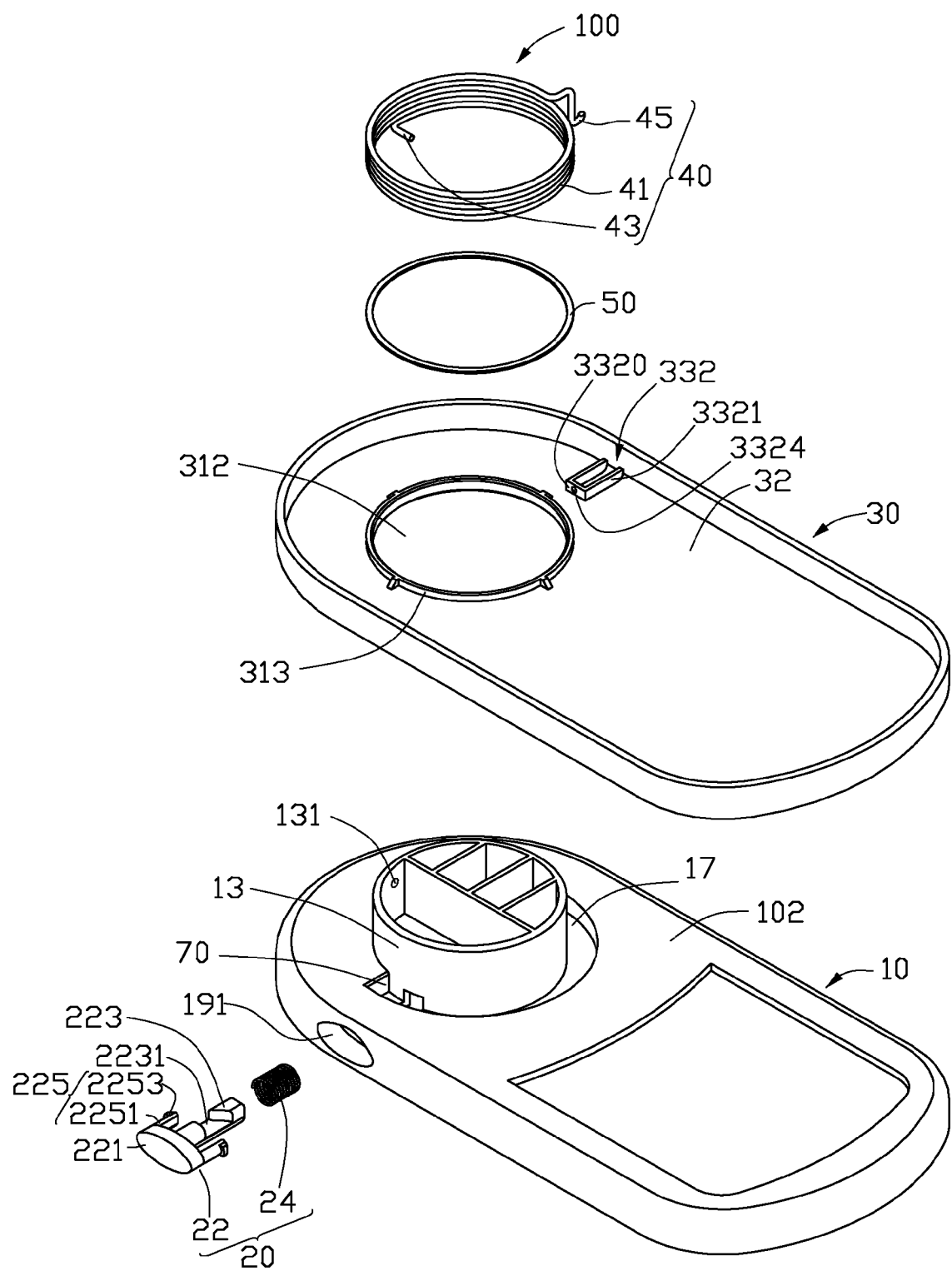
FIG. 1 is an exploded, isometric view of an exemplary rotating mechanism.
Figure 2:
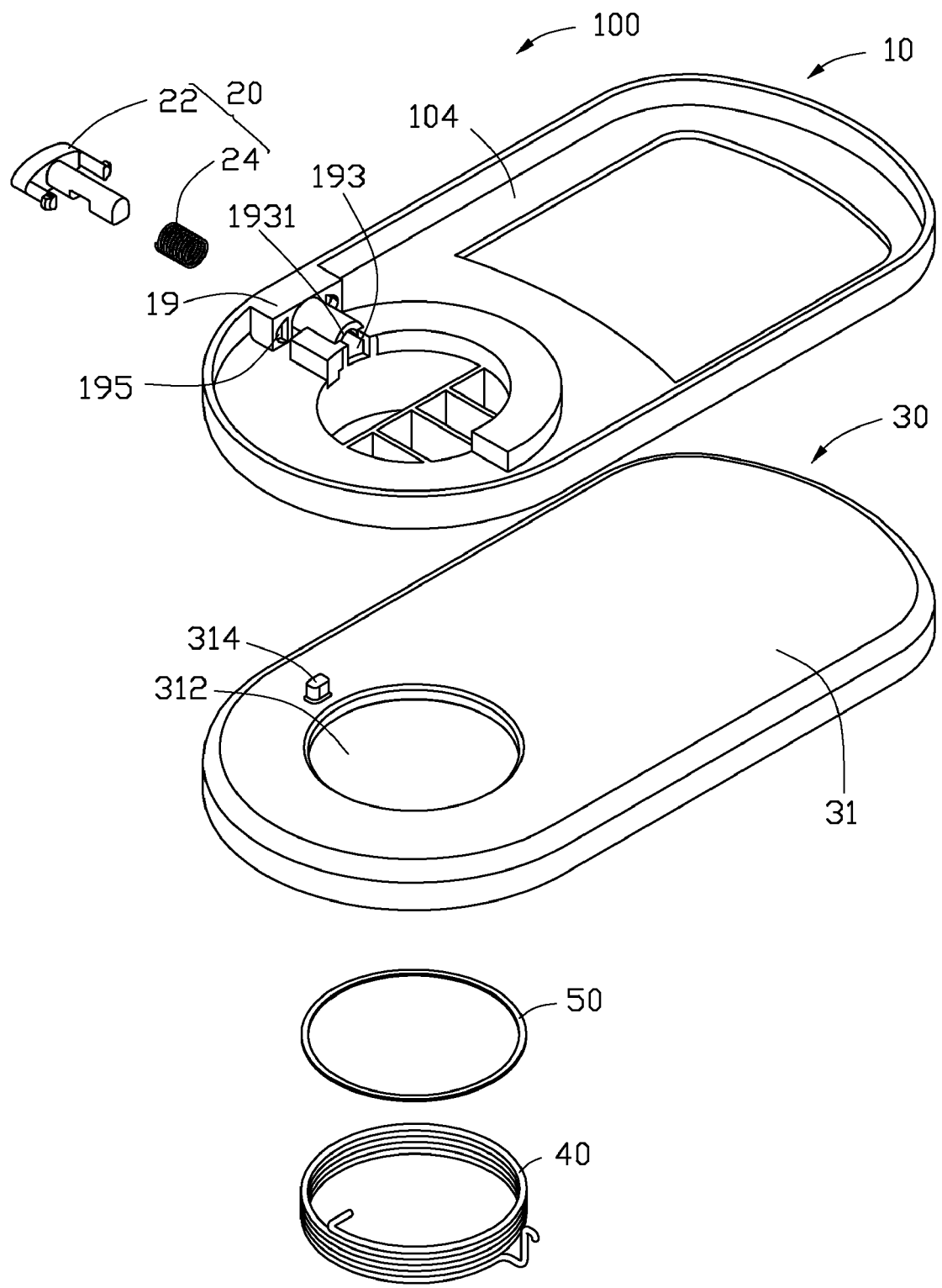
FIG. 2 is similar to FIG. 1, but viewed from another angle.

FIGS. 1 and 2 show an exemplary rotating mechanism 100 including a base 10, a rotary cover 30, a torsion spring 40, a cushion 50 and a locking module 20.

The base 10 includes an upper surface 102 and an opposite lower surface 104. A cylindrical sleeve 13 is formed at one end of the upper surface 102. The sleeve 13 defines a pin hole 131 in an outer circumferential wall thereof. Adjacent to one side of the sleeve 13, the upper surface 102 defines an arcuate sliding groove 17. The sliding groove 17 covers 180 degrees. A recess 191 is defined in a side of the base 10 adjacent to the sleeve 13. A protrusion 19 is formed on the lower surface 104 in a position corresponding to the recess 191. The protrusion 19 defines two cavities 195 and a hole 193 between the two cavities 195. The hole 193 and the recess 191 communicate with each other.

The rotary cover 30 has a first surface 31 and an opposite second surface 32. One end of the first surface 31 defines a receiving hole 312 for rotatably receiving the sleeve 13. A cylindrical flange 313 is formed on the second surface 32 in a position corresponding to the receiving hole 312. Adjacent to the receiving hole 312, a block 314 is formed on the first surface 31. The block 314 is configured for slidably engaging the sliding groove 17. The second surface 32 positions a fixing portion 332. The fixing portion 332 is substantially a U-shaped frame, and includes a top board 3320 and two side boards 3321. The top board 3320 defines a pivot hole 3324.

The torsion spring 40 has a generally cylindrical coiled portion 41. An inner diameter of the coiled portion 41 is substantially equal to an outer diameter of the sleeve 13, thereby allowing the coiled portion 41 to be placed around the sleeve 13. The coiled portion 41 has a first end portion 43 and a second end portion 45. The first end portion 43 is bent in a radial direction toward an axis of the coiled portion 41. The second end portion 45 is bent in an axial direction, and is further perpendicularly bent adverse to the axis. The first end portion 43 is used to be securely locked in the pin hole 131, and the second end portion 45 is used for being securely engaged in the pivot hole 3324.

A diameter of the cushion 50 is substantially equal to an outer diameter of the sleeve 13. The cushion 50 can be made of plastic or rubber, and positioned between the torsion spring 40 and the flange 313 of the rotary cover 30, for reducing friction therebetween.

The locking module 20 includes a coil spring 24 and a locking member 22. An external diameter of the coil spring 24 is smaller than the diameter of the recess 191 so that the coil spring 24 may be inserted into the recess 191. The locking member 22 includes an actuating portion 221, a locking portion 223, and two hooking portions 225. The actuating portion 221 is to be manually actuated (e.g., pressed) and is slidably received in the recess 191. The locking portion 223 is a generally cylindrical post positioned between the two hooking portions 225. An inner diameter of the coil spring 24 is larger than the locking portion 223 so that the coil spring 24 may be placed around the locking portion 223. The locking portion 223 can slidably engage into the hole 193. The locking portion 223 defines a generally arcuate sliding notch 2231.

The two hooking portions 225 can be engaged and hooked in the two cavities 195, respectively. The hooking portions 225 are made resilient, including two arms 2251 and two distal hooking ends 2253. The hooking ends 2253 can hook the hooking portions 225 in the cavities 195.

Figure 3:
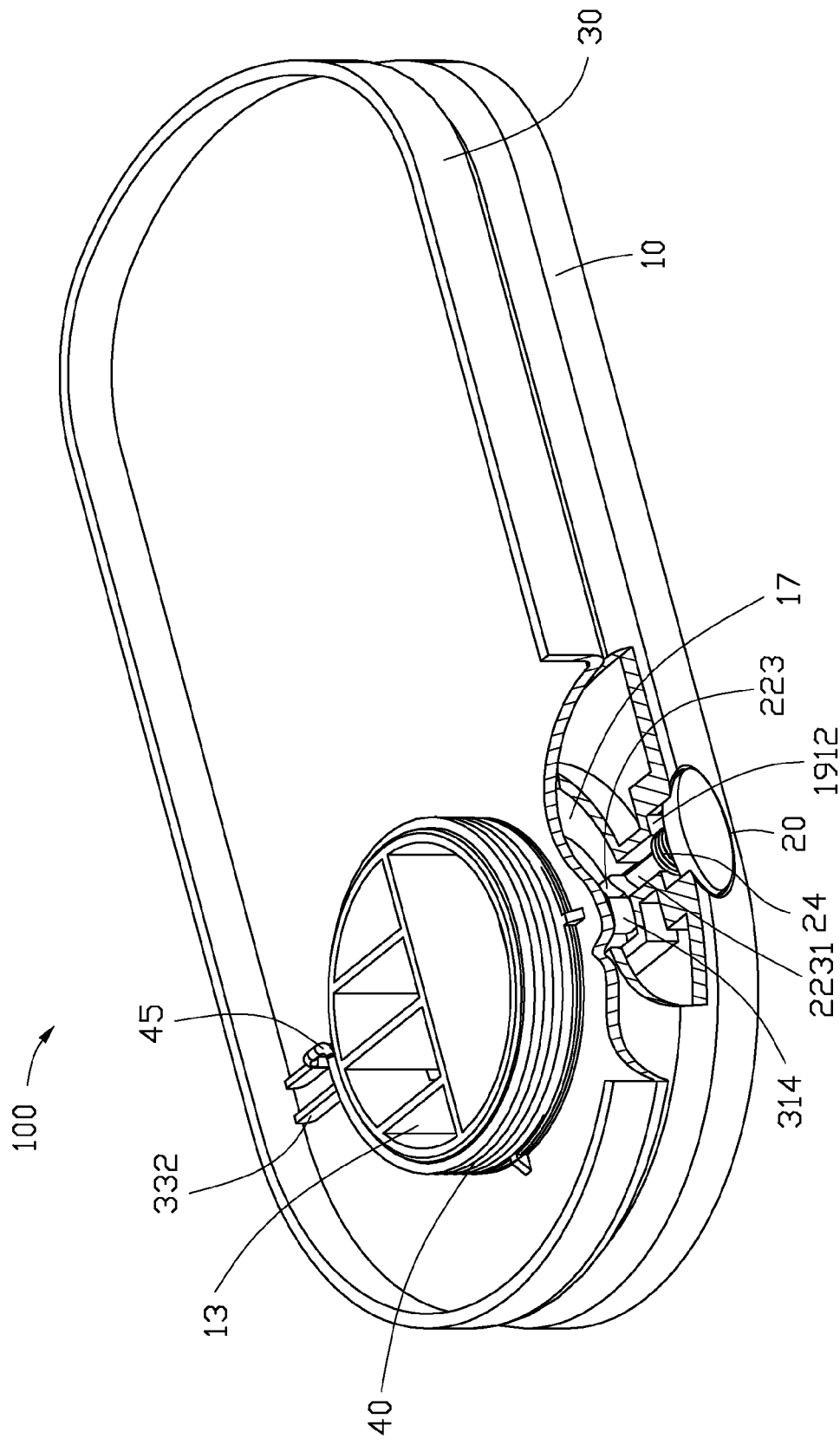
FIG. 3 is a partially cut-away view of the rotating mechanism in a closed state.

Referring to FIG. 3, the rotating mechanism 100 is in a closed position. The coil spring 24 is placed around the locking portion 223 in the recess 191. The coil spring 24 is elastically deformed facilitating the engaging of the locking member 22 within the base 10. The locking member 22 is slidable relative to the base 10. The sleeve 13 protrudes from the receiving hole 312 and the cushion 50 and the torsion spring 40 are placed around the sleeve 13. The cushion 50 is on the flange 313 and between the flange 313 and the torsion spring 40. The first end portion 43 is inserted into the pin hole 131, and the second end portion 45 is inserted into the pivotal hole 3324. At an initial state, the torsion spring 40 has a predetermined torsion force so the cover 30 is biased towards opening, and the block 314 received in the sliding groove 17 resists against the distal end of the locking portion 223 beyond the sliding notch 2231.

Figure 4:
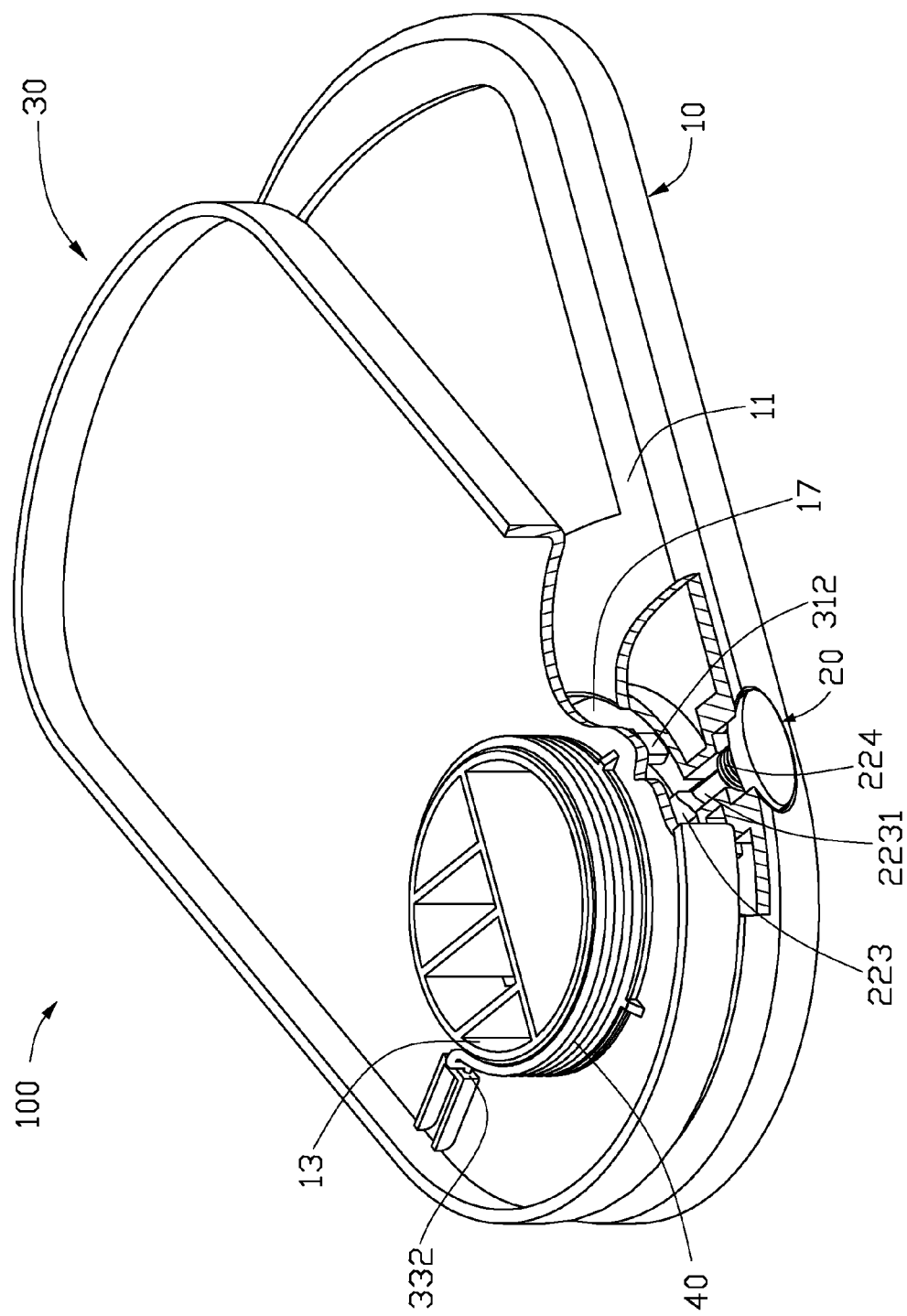
FIG. 4 is an partly opened state view of the rotating mechanism of FIG. 3.
Figure 5:
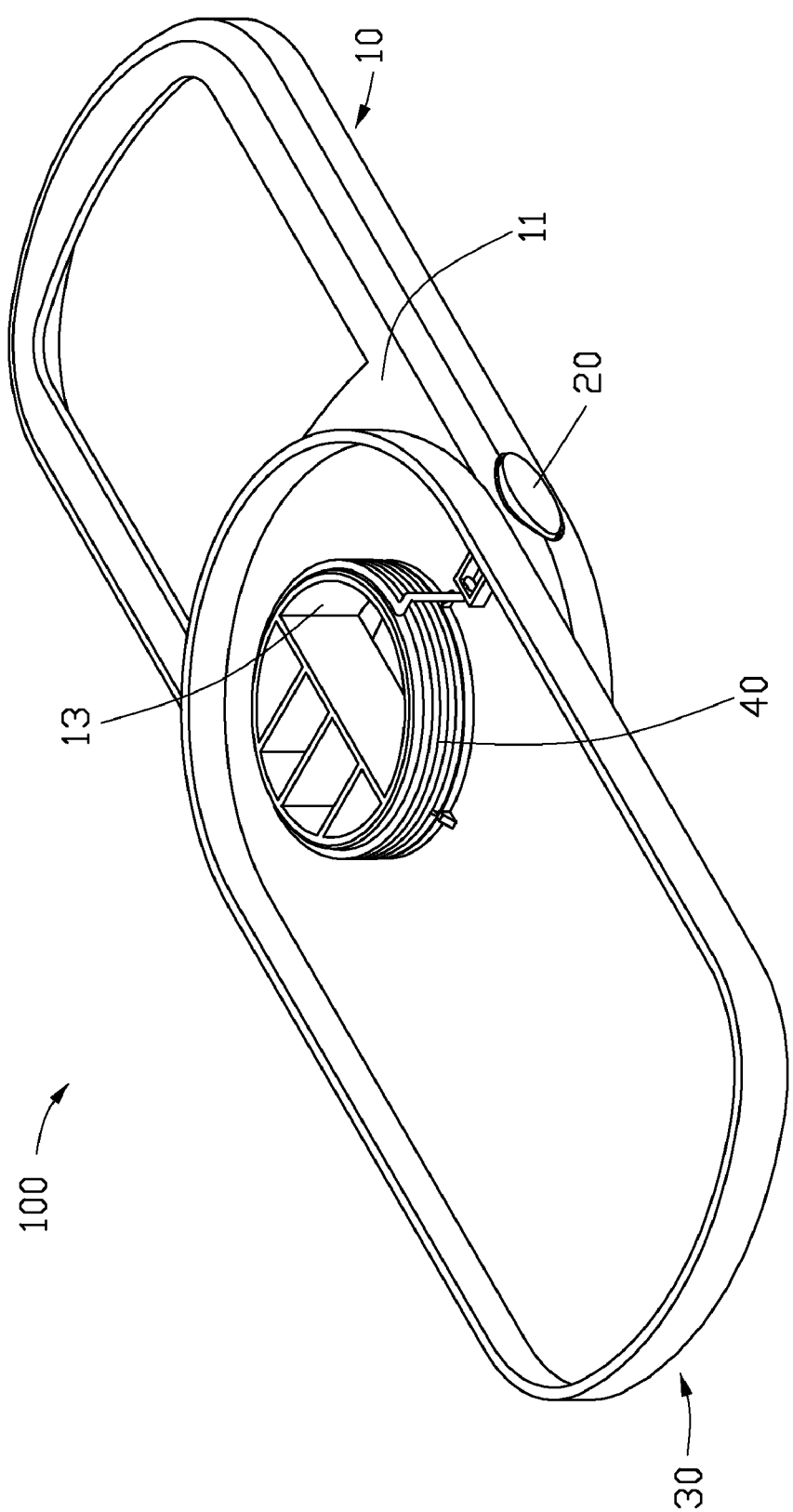
FIG. 5 is a completely opened state view of the rotating mechanism of FIG. 3.

Referring to FIGS. 4 and 5, to open the rotating mechanism 100, the actuating portion 221 is pressed into the recess 191. The locking portion 223 slides within the hole 193 relative to the block 314. In other words, the block 314 slides along the locking portion 223. During this stage, the coil spring 24 is further compressed with an increased elastic force which will return the coil spring 24 after removal of the pressing force on the actuating portion 221. When the block 314 reaches a position completely received in the sliding notch 2231, the block 314 is driven by the torsional force of the torsion spring 40 to slide through the sliding notch 2231 and into the sliding groove 17. Accordingly, the rotary cover 30 automatically rotates due to the torsion spring 40. The block 314 further slides along the sliding groove 17 until the block 314 reaches the end of the sliding groove 17. At that time, the rotary cover 30 is automatically opened 180 degrees.

To close the rotary mechanism 100, the rotary cover 30 is reversely rotated until the block 314 passes over the locking portion 223. The locking portion 223 resists against and locks the block 314. As the rotary cover 30 is rotated into the closed position relative to the base 10, the torsion spring 30 accumulates torsional energy for the next opening process.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A rotary mechanism, comprising:
    a base;
    a cover rotatably mounted on the base and having a block arranged thereon;
    a torsion spring having two ends, the ends of the torsion spring fixed to the base and the cover, respectively; and
    a locking module limiting the cover from rotating relative to the base, the locking module comprises a locking member, the locking member comprising a locking portion defining a sliding notch;
    wherein when the cover locks the base, the block resists the locking portion, when the cover overcomes the limitation of the locking module, the cover automatically rotates relative to the base due to a complete receiving of the block in the sliding notch, a sliding of the block through the notch and then a releasing of the torsion spring.

2. The rotary mechanism as claimed in claim 1, wherein the locking member is slidably engaged within the base and configured for locking the cover in a closed position relative to the base and slidably actuated to release the cover from the closed position to an opened position relative to the base.

3. The rotary mechanism as claimed in claim 2, wherein:
    when the block is completely received in the sliding notch, the block slides through the sliding notch, allowing the cover to open relative to the base.

4. The rotary mechanism as claimed in claim 3, wherein the base defines a sliding groove configured such that the block sliding through the sliding notch can slide into and along the sliding groove to further open the cover relative to the base.

5. The rotary mechanism as claimed in claim 1, wherein the cover defines a receiving hole, and the base forms a sleeve, and the sleeve is rotatably received in the receiving hole.

6. The rotary mechanism as claimed in claim 5, wherein the sleeve defines a pin hole, the cover forms a fixing portion, one end of the torsion spring is locked in the pin hole, and another end of the torsion spring is locked in the fixing portion.

7. The rotary mechanism as claimed in claim 6, wherein the fixing portion includes a bottom board and two side boards, the bottom board defining a pivot hole.

8. The rotary mechanism as claimed in claim 1, wherein the torsion spring has a first end portion and a second end portion, the first end portion is bent in an axial direction of the torsion spring, and the second end portion is bent away from the axial direction of the torsion spring.

9. The rotary mechanism as claimed in claim 1, wherein the base defines a sliding groove, the cover forms a block, the block is slidably received in the sliding groove.

10. The rotary mechanism as claimed in claim 1, further comprising a cushion positioned between the cover and the torsion spring.

11. A portable electronic device, comprising:
    a base;
    a cover rotatably mounted to the base and having a block arranged thereon;
    a torsion spring having two ends, the ends of the torsion spring fixed to the base and cover, respectively; and
    a locking module limiting the cover from rotating relative to the base, the locking module comprises a locking member, the locking member comprising a locking portion defining a sliding notch;
    wherein when the cover locks the base, the block resists the locking portion, when the cover overcomes the limitation of the locking module, the cover automatically rotates relative to the base due to a complete receiving of the block in the sliding notch, a sliding of the block through the notch and then a releasing of the torsion spring.

12. The portable electronic device as claimed in claim 11, wherein the locking member is slidably engaged within the base and configured for locking the cover in a closed position relative to the base and slidably actuated to release the cover from the closed position to an opened position relative to the base.

13. The portable electronic device as claimed in claim 12, wherein:
    when the block is completely received in the sliding notch, the block slides through the sliding notch, allowing the cover to open relative to the base.

14. The portable electronic device as claimed in claim 13, wherein the base defines a sliding groove configured such that the block sliding through the sliding notch can slide into and along the sliding groove to further open the cover relative to the base.

15. The portable electronic device as claimed in claim 11, wherein the cover defines a receiving hole, and the base forms a sleeve, and the sleeve is rotatably received in the receiving hole.

16. The portable electronic device as claimed in claim 15, wherein the sleeve defines a pin hole, the cover forms a fixing portion, one end of the torsion spring is locked in the pin hole, and another end of the torsion spring is locked in the fixing portion.

17. The portable electronic device as claimed in claim 16, wherein the fixing portion includes a bottom board and two side boards, the bottom board defining a pivotal hole.

18. The portable electronic device as claimed in claim 11, wherein the torsion spring has a first end portion and a second end portion, the first end portion is bent in an axial direction of the torsion spring, and the second end portion is bent away from the axial direction of the torsion spring.

19. The portable electronic device as claimed in claim 11, wherein the base defines a sliding groove, the cover forms a block, the block is slidably received in the sliding groove.

20. The portable electronic device as claimed in claim 11, further comprising a cushion positioned between the cover and the torsion spring.

* * * * *